United States Patent [19]

Mazumder

[11] Patent Number: 4,613,774
[45] Date of Patent: Sep. 23, 1986

[54] UNITARY MULTIPLEXER-DECODER CIRCUIT

[75] Inventor: Nikhil C. Mazumder, San Jose, Calif.

[73] Assignee: Advanced Micro Devices, Inc., Sunnyvale, Calif.

[21] Appl. No.: 629,032

[22] Filed: Jul. 9, 1984

[51] Int. Cl.[4] ............... H03K 19/013; H03K 19/086; H03K 19/20; G05F 3/22

[52] U.S. Cl. ................... 307/463; 307/455; 307/467; 307/297; 323/283; 323/313

[58] Field of Search ............... 307/243, 463, 443, 454, 307/455, 466, 467, 296 R, 296 A, 297; 340/803, 804; 323/282, 283, 311–313, 315

[56] References Cited

U.S. PATENT DOCUMENTS

| | | | |
|---|---|---|---|
| 3,539,824 | 11/1970 | Yu et al. .......................... | 307/455 |
| 4,348,747 | 9/1982 | Takahashi ..................... | 307/463 X |
| 4,354,266 | 10/1982 | Cooperman ................... | 307/243 X |
| 4,551,638 | 11/1985 | Varadarajan .................. | 307/455 |

OTHER PUBLICATIONS

Gersbach et al, "Cascode Decoder", *IBM TDB;* vol. 8, No. 4, pp. 642–643; 9/1965.
Gosch, "Bipolar Multiplexer Can Reach 2Gb/s"; *Electronics;* p. 96; 10/6/1983.

*Primary Examiner*—Larry N. Anagnos
*Attorney, Agent, or Firm*—Patrick T. King; Davis Chin; J. Vincent Tortolano

[57] ABSTRACT

A unitary multiplexer-decoder circuit integrated on a single semiconductor chip includes a first reference transistor, a plurality of first data input transistors, a second reference transistor, a plurality of second data input transistors, an emitter follower, a first current source and a second current source. A reference voltage generator is provided for generating first and second reference potentials and is formed on the same integrated circuit substrate as the multiplexer-decoder circuit.

19 Claims, 8 Drawing Figures

(a) MUX          (b) DECODER

UNITARY MULTIPLEXER-DECODER CIRCUIT

BACKGROUND OF THE INVENTION

This invention relates generally to semiconductor circuits and more particularly, it relates to a unitary multiplexer-decoder circuit which is formed as an integrated circuit on a single semiconductor chip to provide a higher speed of operation.

In general, a block diagram of the prior art is illustrated in FIG. 1 which includes a plurality of multiplexer circuits 2 and a plurality of decoder circuits 4. Each of the multiplexer circuits is formed from a schematic diagram of FIG. 2(a), and each of the decoder circuits is formed from a schematic diagram of FIG. 2(b). As can be seen, plurality of data input signals either $A_0, A_1 \ldots$ through $A_n$ or $B_0, B_1 \ldots$ through $B_n$ are required to be passed through the plurality of multiplexer circuits 2 whose outputs are then decoded by the respective plurality of decoders 4. A common control signal S is applied to the control input of each multiplexer circuit so as to selectively pass either the data inputs $A_0 \ldots A_n$ or the data inputs $B_0 \ldots B_n$ to generate output signals $Y_0 \ldots Y_{2n+1}$ of the decoder circuits. For example, when $S=0$ the data inputs $A_0 \ldots A_n$ are selected and when $S=1$ the data inputs $B_0 \ldots B_n$ are selected.

Thus, the data input signals are required to pass through two emitter coupled logic (ECL) gates (one in the multiplexer and one in the decoder) which increase the propagation delays. Further, the number of current sources required for the multiplexer circuits is 3n and the number of current sources required for the decoder circuits is $2^{n+1}$. This gives a total number of $3n + 2^{n+1}$ current sources where n is the number of data input signals.

It would therefore be desirable to provide a unitary multiplexer-decoder circuit which is formed as an integrated circuit on a single semiconductor chip which has only a signle gate delay and has a significantly reduced number of current sources and components, thereby increasing the efficienty and speed of operation.

SUMMARY OF THE INVENTION

Accordingly, it is a general object of the present invention to provide a unitary multiplexer-decoder circuit which is fabricated as an integrated circuit on a single semiconductor chip to provide a higher speed of operation.

It is another object of the present invention to provide a unitary multiplexer-decoder circuit formed as an integrated circuit on a single semiconductor chip which has only a single gate delay and has a significantly reduced number of current sources and components.

It is still another object of the present invention to provide a unitary multiplexer-decoder circuit integrated on a semiconductor chip which includes a reference voltage generator formed in the same integrated circuit substrate as the multiplexer-decoder circuit.

In accordance with these aims and objectives, the instant invention is concerned with the provision of a unitary multiplexer-decoder circuit integrated on a single semiconductor chip which includes a first reference transistor having its collector connected to a supply potential and its base connected to a first reference potential. A plurality of first data input transistors is provided which has all of its collectors commonly coupled together, all of its emitters commonly coupled together and its bases being connected to a first set of input terminals. The common collector of the first input transistors are connected to the supply potential through a load resistor, and the common emitters of the first input transistors are connected to the emitter of the first reference transistor. A second reference transistor is provided which has its collector connected to the collector of the first reference transistor and its base connected to a second reference potential. A plurality of second data input transistors is provided which has all of the collectors commonly coupled together and its bases being connected to a second set of input terminals. The common collectors of the second input transistors are connected to the common emitters of the first input transistors. The common emitters of the second input transistors are connected to the emitter of the second reference transistor. An emitter follower transistor has its collector connected to the supply potential, its base connected to the common collectors of the first input transistors and its emitter connected to an output terminal. A first current source is connected to the emitter of the second reference transistor, and a second current source is connected to the emitter of the emitter follower transistor. A reference voltage generator is provided for generating the first and second reference potentials and is formed on the same integrated circuit substrate as the multiplexer-decoder circuit.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
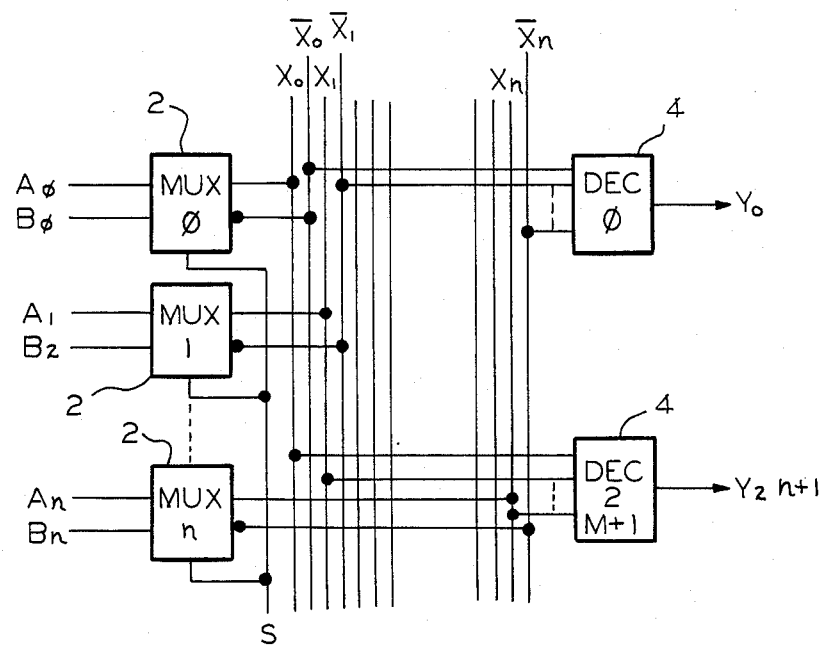
FIG. 1 is a block diagram illustrating conventional multiplexer and decoder circuits of the prior art.
Figure 2:
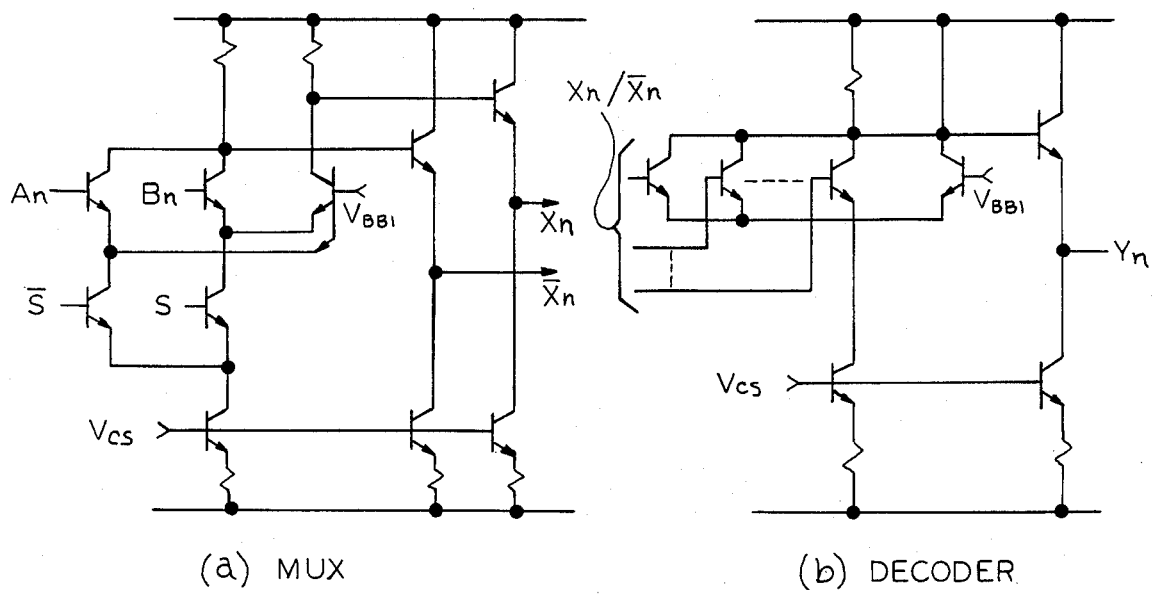
FIG. 2(a) and 2(b) are schematic diagrams of the multiplexer and decoder circuits of FIG. 1.
Figures 3, 4:
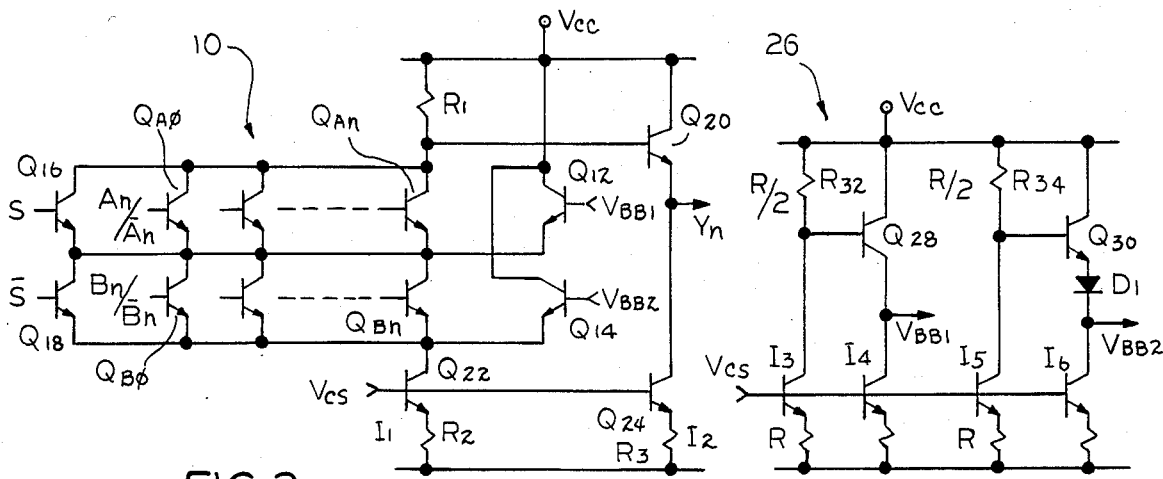
FIG. 3 is a schematic diagram of a unitary multiplexer-decoder circuit according to the prior art.
FIG. 4 is a schematic diagram of a reference voltage generator for the circuit of FIG. 3.

Referring now in detail to the various views of the drawings, there is shown in FIG. 3 a schematic diagram of a unitary multiplexer-decoder circuit 10 of the prior art which is constructed as an integrated circuit on a single semiconductor chip. This multiplexer-decoder circuit 10 performs the same functions as the individual and separate multiplexer and decoder circuits shown in FIG. 2(a) and 2(b), but is comprised of a reduced number of circuit components; namely, there is required only a single ECL gate and $2^{n+1}$ current sources, thereby improving the speed and efficiency of the integrated circuit while decreasing power consumption and lowering manufacturing cost.

The multiplexer-decoder circuit 10 includes a first reference transistor Q12 and a second reference transistor Q14. The collector of the transistor Q12 is connected to a supply voltage or potential $V_{CC}$ and to the collector of transistor Q14. The base of the transistor Q12 is tied to a first reference potential $V_{BB1}$, and the base of the transistor Q14 is tied to a second reference potential $V_{BB2}$. A plurality of first or upper level data input transistors $Q_{A0}$... $Q_{An}$ are provided in which all of the collectors are commonly tied together and to one end of a load resistor R1. The other end of the resistor R1 is connected to the supply potential. All of the emitters of the first input transistors $Q_{A0}$... $Q_{An}$ are commonly tied together and to the emitter of the first reference transistor Q12. The bases of the input transistors $A_{A0}$... $Q_{An}$ are connected to a first set of input terminals which receive respective data input signals $A_0$... $A_n$ or complementary data input signals $\bar{A}_0$... $\bar{A}_n$, where n is the number of bits. A plurality of second or lower level data input transistors $Q_{B0}$... $Q_{Bn}$ are provided in which all of the collectors are commonly connected together and to the common emitters of the first data input transistors $Q_{A0}$... $Q_{An}$. All of the emitters of the second input transistors $Q_{B0}$... $Q_{Bn}$ are commonly tied together and to the emitter of the second reference transistor Q14. The bases of the second input transistors $Q_{B0}$... $Q_{Bn}$ are connected to a second set of input terminals which receive respective data input signals $B_0$... $B_n$ or complementary data input signals $\bar{B}_0$... $\bar{B}_n$.

A true control signal transistor Q16 has its collector connected to the common collectors of the first input transistors and its emitter connected to the common emitters of the first input transistors. The base of the control transistor Q16 is coupled to a terminal for receiving a true control signal S. A complementary control signal transistor Q18 has its collector also coupled to the common emitters of the first input transistors and its emitter coupled to the common emitters of the second input transistors. The base of the complementary transistor Q18 is coupled to a control terminal which receives a complementary control signal $\bar{S}$.

An emitter follower transistor Q20 has its base connected to the one end of the load resistor R1, its collector connected to the supply potential $V_{CC}$, and its emitter connected to an output terminal to provide output signals $Y_n$. A first current source I1 is connected to the emitter of the second reference transistor Q14. The current source I1 is formed of a transistor Q22 and an emitter resistor R2. A second current source I2 is connected to the emitter of the emitter follower transistor Q20. The current source I2 is formed of a transistor Q24 and an emitter resistor R3.

In operation, when the true control signal S is in the high or "1" level, the upper level input transistors $Q_{A0}$... $Q_{An}$ are inactivated so that the data $B_0$... $B_n$ on the second data input transistors are decoded to form the output signals $Y_n$. When the true control signal S is in the low or "0" level, the second input transistors $Q_{B0}$... $Q_{Bn}$ are inactivated so that the data $A_0$... $A_n$ on the first data input transistors are decoded to form the output signals $Y_n$.

In order to generate the reference voltages $V_{BB1}$ and $B_{BB2}$, there is illustrated in FIG. 4 a schematic diagram of a reference voltage generator 26 for driving the bases of the transistors Q12 and Q14 in the unitary multiplexer-decoder circuit 10 of FIG. 3. The reference voltage generator 26 includes a first supply transistor 28 and a second supply transistor 30. The transistor Q28 has its collector connected to a supply potential $V_{CC}$, its base connected to the supply potential via a bias resistor R32, and its emitter being adapted for connection to the base of transistor Q12 (FIG. 3). The base and emitter of transistor Q28 are each tied to respective current sources I3 and I4. Similarly, the second supply transistor Q30 has its collector connected to the supply potential $V_{CC}$, its base connected to the supply potential via a bias resistor R34, and its emitter being adapted for connection via diode D1 to the base of the transistor Q14. The base and emitter of the transistor Q30 are each tied to respective current sources I5 and I6. It should be understood by those skilled in the art that the reference voltage generator 26 may be formed on the same integrated substrate as the unitary multiplexer-decoder circuit 10.

Figure 5:
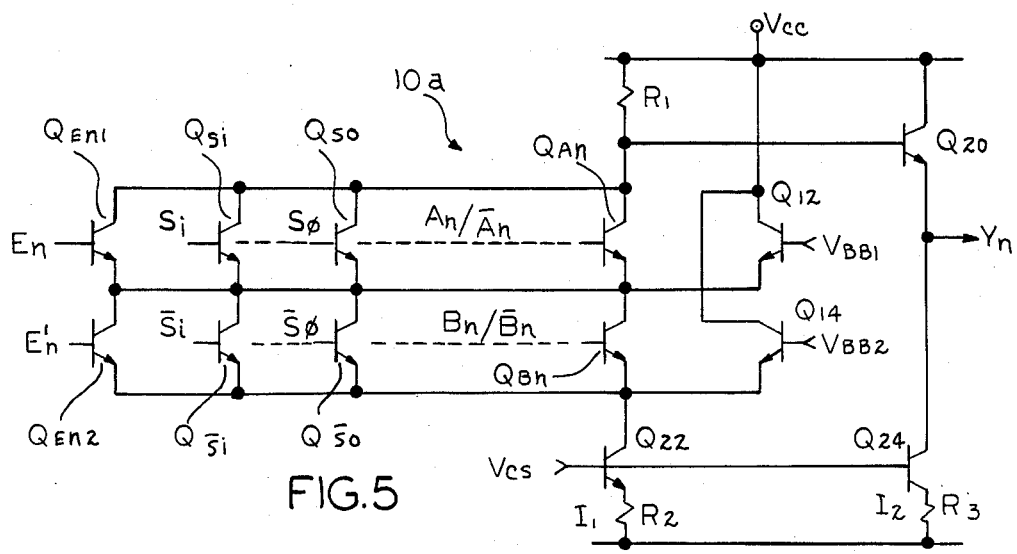
FIG. 5 is a schematic diagram of another embodiment of a unitary multiplexer circuit according to the prior art.

In certain other applications, there is sometimes required the need of an enabling signal and also a plurality of control signals. Thus, a schematic diagram of another embodiment of the prior art incorporating these signals is shown in FIG. 5. It will be noted that this unitary multiplexer-decoder circuit 10a is the same as the circuit of FIG. 3, but with the addition of (1) a plurality of true control signal transistors, (2) a first enable transistor, (3) a plurality of complementary control signal transistors, and (4) a second enable transistor.

As can be seen, all of the collectors of the true control signal transistors $Q_{S0}$... $Q_{Si}$ are commonly tied together and to the common collectors of the first input transistors $Q_{A0}$... $Q_{An}$. All of the emitters of the true control transistors are commonly tied together and to the common emitters of the first input transistors. The bases of the true control transistors are connected to control terminals which receive respective true control signals $S_0$... $S_i$. A first enable transistor $Q_{En1}$ has its collector coupled to the common collectors of the true control transistors and its emitter coupled to the common emitters of the first input transistors. The base of the first enable transistor is coupled to an enable terminal which receives an enable signal $E_n$. Further, all of the collectors of the complementary control signal transistors $Q_{\bar{S}0}$... $Q_{\bar{S}i}$ are commonly tied to each other and to the common collectors of the second input transistors $Q_{B0}$... $Q_{Bn}$. All of the emitters of the complementary control transistors are commonly tied together and to the common emitters of the second input transistors. The bases of the complementary transistors are connected to control terminals which receive respective complementary control signals $\bar{S}_0$... $\bar{S}_i$. The collector of the second enable transistor $E_{En2}$ is coupled to the emitter of the first enable transistor. The emitter of the second enable transistor is coupled to the common emitters of the second input transistors. The base of the second enable transistor is coupled to an enable terminal which receives the enable signal $E'_n$.

However, this second prior art embodiment of FIG. 5 suffers from the disadvantages of increased number of transistors both in the upper and lower levels and consequently increased node capacitance. Further, only one of the control signals $S_0$... $S_i$ can be operated at a time. All of these disadvantages are eliminated in a preferred embodiment of the present invention which is illustrated in FIG. 6 of the drawings.

It will be noted that this unitary multiplexer-decoder circuit 10b is again the same as the circuit of FIG. 3 except that the true and complementary control signal transistors Q16 and Q18 have been eliminated. Thus, a detailed description of this circuit of FIG. 6 and its interconnection of the components are not believed to be necessary. As can be seen, the plurality of control signal transistors of FIG. 5 are not used directly in the multiplexer-decoder circuit 10b, but are rather incorporated into a bias generator 36 illustrated in FIG. 7. Also, the enable transistors of FIG. 5 are also not used in the multiplexer-decoder circuit 10b and are combined with the bias generator 36 of FIG. 7.

Figures 6, 7:
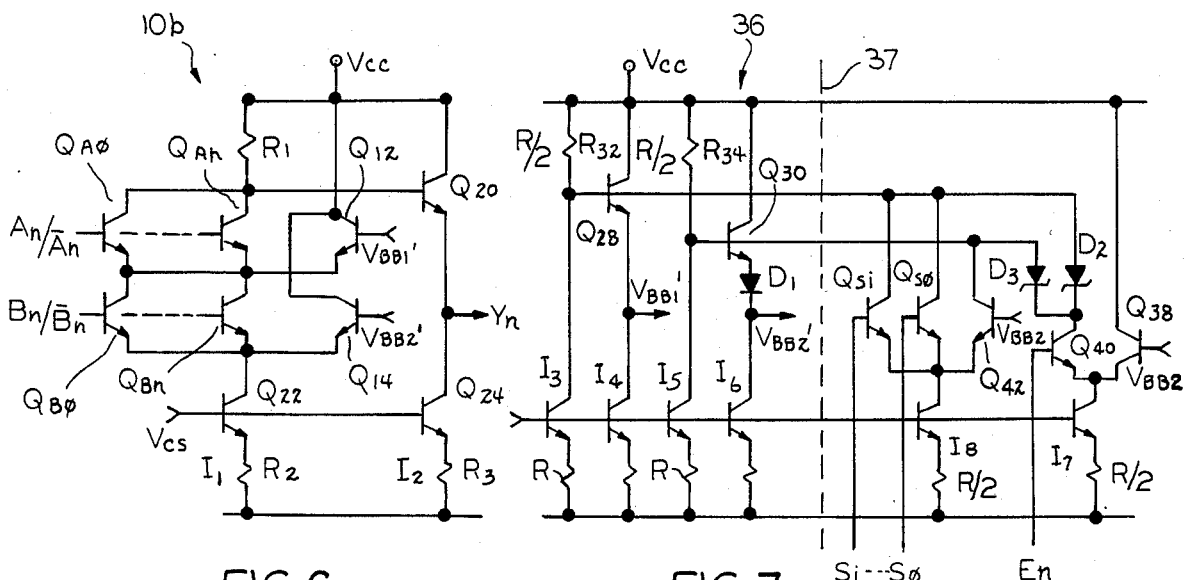
FIG. 6 is a schematic diagram of an embodiment of a unitary multiplexer-decoder circuit of the present invention.
FIG. 7 is a schematic diagram of a reference voltage generator for the circuit of FIG. 6.

The bias generator 36 is used to generate the reference voltages $V_{BB1}'$ and $V_{BB2}'$ for the multiplexer-decoder circuit 10b of FIG. 6. The elements to the left of the dotted line 37 in the bias generator 36 are identical to the circuit of FIG. 4. In addition, there is provided a first reference transistor Q38 in which the collector is connected to a supply potential $V_{CC}$ and the base is connected to a bias voltage $V_{BB2}$. The collector of an enable transistor Q40 is connected to the base of the transistor Q28 via the diode D2 and to the base of the transistor Q30 via diode D3. The base of the enable transistor Q40 is connected to an enable terminal which receives an enable signal $E_n$ and its emitter is connected to the emitter of the reference transistor Q38. A current source 17 is connected to the common emitters of the transistors Q38 and Q40. A second reference transistor Q42 has its collector connected to the base of the transistor Q30 and its base connected to the bias voltage $V_{BB2}$. A plurality of control signal transistors $Q_{S0} \ldots Q_{Si}$ are provided in which all of the collectors are connected together and to the base of the transistor Q28. All of the emitters of the control signal transistors are coupled together and to the emitter of the second reference transistors Q42. Each of the bases of the control transistors is connected to a control terminal which receives respective control signals $S_0 \ldots S_i$. A current source 18 is coupled to the emitter of the second bias transistor Q42.

In operation, when the enable signal $E_n$ is high or "1" level, the reference voltages $V_{BB1}'$ and $V_{BB2}'$ will be below their normal values so as to turn off the reference transistors Q12 and Q14. Thus, the output signals $Y_n$ will remain low and disabled irrespective of whether the data input signals $A_0 \ldots A_n$ and $B_0 \ldots B_n$ are high or low. When the enable signal $E_n$ is low or enabled, the control signals $S_0 \ldots S_i$ can independently select each of the input signals $A_0 \ldots A_n$ or $B_0 \ldots B_n$. Assuming that the control signal $S_i$ is high, the reference voltage $V_{BB1}'$ will be pulled down below its normal value and thus the transistor Q12 will be turned off. The voltage $V_{BB2}'$ will have its normal value and therefore the output signals $Y_n$ will correspond to the decoded values of the input signals $B_0 \ldots B_n$.

Accordingly, the preferred embodiment of the present invention has the following advantages over the second prior art embodiment as follows:

(1) it requires two less transistors per control signal per gate which reduces node capacitance and increases the speed of operation;

(2) it does not require the use of complementary control signals;

(3) it permits the control signals to be operated independently.

(4) it has only a single gate delay which increases the speed of operation and its efficiency;

(5) it requires only one level of control signals; and (6) it requires a significantly reduced number of current sources and components.

From the foregoing detailed description, it can thus be seen that the present invention provides a unitary multiplexer-decoder circuit which is formed as an integrated circuit on a single semiconductor chip to provide a higher speed of operation. Further, there is provided a bias generator for generating reference voltages which is formed on the same integrated circuit substrate as the unitary multiplexer-decoder circuit.

While there has been illustrated and described what are at present to be considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes for carrying out this invention, but that the invention will include all embodiments falling within the scope of the appended claims.

What is claimed is:

1. A unitary multiplexer-decoder circuit integrated on a single semiconductor chip comprising:

a first reference transistor having its collector connected to a supply potential and its base connected to a first reference potential;

a plurality of the first data input transistors having all of its collectors commonly coupled together, all of its emitters commonly coupled together and its bases being connected to a first set of input terminals, said common collectors of said first input transistors being connected to said supply potential through a load resistor, said common emitters of said first input transistors being connected to the emitter of said first reference transistor;

a second reference transistor having its collector connected to the collector of said first reference transistor and its base connected to a second reference potential;

a plurality of second data input transistors having all of its collectors commonly connected together, all of its emitters commonly coupled together and its bases being connected to a second set of input terminals, said common collectors of said second input transistors being connected to said common emitters of said first input transistors, said common emitters of said second input transistors being connected to the emitter of said second reference transistor;

an emitter follower transistor having its collector connected to said supply potential, its base connected to the common collectors of said first input transistors and its emitter connected to an output terminal;

a first current source connected to the emitter of said second reference transistor;

a second current source connected to the emitter of said emitter follower transistor;

a reference voltage generator for generating said first and said second reference potentials, said reference generator being formed on the same integrated circuit substrate as the multiplexer-decoder circuit; and said reference generator including an enable transistor for turning off said first and second reference transistors.

2. A unitary multiplexer-decoder circuit as claimed in claim 1, wherein said reference generator further includes a first supply transistor having its collector connected to the supply potential, its base connected to the supply potential via a first bias resistor, and its emitter connected to the base of said first reference transistor.

3. A unitary multiplexer-decoder circuit as claimed in claim 2, wherein said reference generator further includes a second supply transistor having its collector connected to the supply potential, its base connected to the supply potential via a second bias resistor, and its emitter connected to the base of said second reference transistor via a first diode.

4. A unitary multiplexer-decoder circuit as claimed in claim 3, wherein said enable transistor has its collector connected to the base of the first supply transistor via a second diode and to the base of the second supply transistor via a third diode.

5. A unitary multiplexer-decoder circuit as claimed in claim 1, wherein first data input signals are applied to the first set of input terminals.

6. A unitary multiplexer-decoder circuit as claimed in claim 5, wherein second data input signals are applied to the second set of input terminals.

7. A unitary multiplexer-decoder integrated on a single semiconductor chip comprising:
a first reference transistor having its collector connected to a supply potential and its base connected to a first reference potential;
a plurality of first data input transistors having all of its collectors commonly coupled together, all of its emitters commonly connected together and its bases being connected to a first set of input terminals, said common collectors of said first input transistors being connected to said supply potential through a load resistor, said common emitters of said input transistors being connected to the emitter of said first reference transistor;
a second reference transistor having its collector connected to the collector of said reference transistor and its base connected to a second reference potential;
a plurality of second data input transistors having all of its collectors commonly coupled together, all of its emitters commonly coupled together and its bases being connected to a second set of input terminals, said common collectors of said second input transistors being connected to said common emitters of said first input transistors, said common emitters of said second input transistors being connected to the emitter of said second reference transistor;
an emitter follower transistor having its collector connected to said supply potential, its base connected to the common collectors of said first input transistors and its emitter connected to an output terminal;
a first current source connected to the emitter of said second reference transistor;
a second current source connected to the emitter of said emitter follower transistor;
a reference voltage generator having first and second supply transistors for generating said first and second reference potentials, said reference generator being formed on the same integrated circuit substrate as the multiplexer-decoder circuit;
said first supply transistor having its collector connected to the supply potential, its base connected to the supply potential via a first bias resistor, and its emitter connected to the base of said first reference transistor;
said second supply transistor having its collector connected to the supply potential, its base connected to the supply potential via a second bias resistor, and its emitter connected to the base of said second reference transistor via a first diode;
said reference generator including an enable transistor having its collector coupled to the bases of said first and second supply transistors;
a third reference transistor having its collector connected to the supply potential, its base connected to a bias voltage and its emitter connected to the emitter of said enable transistor;
a plurality of true control signal transistors having its collectors commonly coupled together, all of its emitters commonly coupled together and its bases being connected to true control signal terminals, said common collectors of said true control signal transistors being connected to the base of said first supply transistor; and
a fourth reference transistor having its collector connected to the base of said second supply transistor, its base connected to the bias voltage and its emitter coupled to the common emitters of said true control signal transistors.

8. A unitary multiplexer-decoder circuit as claimed in claim 7, wherein first data input signals are applied to the first set of input terminals.

9. A unitary multiplexer-decoder circuit as claimed in claim 8, wherein the second data input signals are applied to the second set of input terminals.

10. A unitary multiplexer-decoder circuit as claimed in claim 9, wherein a second diode is connected between the base of said first supply transistor and the collector of said enable transistor, and a third diode is connected between the base of said second supply transistor and the collector of said enable transistor.

11. A unitary multiplexer-decoder circuit integrated on a single semiconductor chip comprising:
a first reference transistor having its collector connected to a supply potential and its base connected to a first reference potential;
a plurality of first data input transistors having all of its collectors commonly connected together, all of its emitters commonly coupled together and its bases being connected to a first set of input terminals, said common collectors of said first input transistors being connected to said supply potential through a load resistor, said common emitters of said first input transistors being connected to the emitter of said first reference transistor;
a second reference transistor having its collector connected to the collector of said first reference transistor and its base connected to a second reference potential;
a plurality of second data input transistors having all of its collectors commonly coupled together, all of its emitters commonly coupled together and its bases being connected to a second set of input terminals, said common collectors of said second input transistors being connected to said common emitters of said first input transistors, said common emitters of said second input transistors being connected to the emitter of said second reference transistor;

an emitter follower transistor having its collector connected to said supply potential, its base connected to the common collectors of said first input transistors and its emitter connected to an output terminal;

a first current source connected to the emitter of said second reference transistor;

a second current source connected to the emitter of said emitter follower transistor;

a reference voltage generator means for generating said first and second reference potentials, said reference generator means being formed on the same integrated circuit substrate as the multiplexer-decoder circuit; and said reference generator means including an enable transistor for turning off said first and second reference transistors.

12. A unitary multiplexer-decoder circuit as claimed in claim 11, wherein first data input signals are applied to the first of input terminals.

13. A unitary multiplexer-decoder circuit as claimed in claim 12, wherein second data input signals are applied to the second set of input terminals.

14. A unitary multiplexer-decoder circuit as claimed in claim 13, wherein said reference generator means includes a first supply transistor and a second supply transistor, said first supply transistor having its collector connected to the supply potential, its base connected to the supply potential via a first bias resistor, and its emitter connected to the base of said first reference transistor, said second supply transistor having its collector connected to the supply potential, its base connected to the supply potential via a second bias resistor, and its emitter connected to the base of said second reference transistor via a first diode.

15. A unitary multiplexer-decoder circuit as claimed in claim 14, wherein said reference generator means includes a plurality of true control signal transistors having its collectors commonly coupled together, all of its emitters commonly coupled together and its bases being connected to true control signal terminals, said common collectors of said true control signal transistors being connected to the base of said first supply transistor.

16. A unitary multiplexer-decoder circuit as claimed in claim 15, wherein said enable transistor has its collector connected to the base of the first supply transistor via a second diode and to the base of the second supply transistor via a third diode.

17. A unitary multiplexer-decoder circuit as claimed in claim 16, wherein the base of said enable transistor receives an enable signal.

18. A unitary multiplexer-decoder circuit as claimed in claim 15, wherein the bases of said true control signal transistors are connected to true control signal terminals.

19. A unitary multiplexer-decoder circuit as claimed in claim 18 wherein when the bases of said true control signal transistors connected to the true control signal terminals receive a high level, the second data input signals are decoded to form the output signals.

* * * * *